United States Patent [19]

Nakato

[11] Patent Number: 5,278,077
[45] Date of Patent: Jan. 11, 1994

[54] PIN-HOLE PATCH METHOD FOR IMPLANTED DIELECTRIC LAYER

[75] Inventor: Tatsuo Nakato, Vancouver, Wash.

[73] Assignee: Sharp Microelectronics Technology, Inc., Camas, Wash.

[21] Appl. No.: 28,832

[22] Filed: Mar. 10, 1993

[51] Int. Cl.⁵ .......................... H01L 21/266
[52] U.S. Cl. ...................... 437/27; 437/25; 437/63; 437/24
[58] Field of Search ............ 437/21, 24, 25, 26, 437/27, 63, 64, 923; 148/DIG.3

[56] References Cited

U.S. PATENT DOCUMENTS

| | | | |
|---|---|---|---|
| 4,837,172 | 6/1989 | Mizuno et al. | 437/24 |
| 4,975,126 | 12/1990 | Margail et al. | 437/25 |
| 5,047,356 | 9/1991 | Li et al. | 437/21 |
| 5,080,730 | 1/1992 | Wittkower | 437/24 |
| 5,143,858 | 9/1992 | Tomozane et al. | 437/24 |
| 5,196,355 | 3/1993 | Wittkower | 437/24 |

*Primary Examiner*—Brian E. Hearn
*Assistant Examiner*—C. Chaudhari
*Attorney, Agent, or Firm*—Fliesler, Dubb, Meyer & Lovejoy

[57] ABSTRACT

Pin-holes or thin sections in the implanted dielectric layer of a SIMOX device are patched by forming a reverse biasable PN junction within the depth range of or proximate to the dielectric layer. A charge depletion zone forms about the PN junction when the latter is reverse-biased and reinforces or patches weak spots in the implanted dielectric layer such as pin-holes and thin-sections.

1 Claim, 3 Drawing Sheets

PIN-HOLE PATCH METHOD FOR IMPLANTED DIELECTRIC LAYER

BACKGROUND

1. Field of the Invention

The invention relates generally to the fabrication of semiconductor devices. The invention relates more specifically to a method for forming a high quality buried isolation layer in a SIMOX structure.

2a. Cross Reference to Related Applications

The following copending U.S. patent application(s) is/are assigned to the assignee of the present application, is/are related to the present application and its/their disclosures is/are incorporated herein by reference:

(A) Ser. No. 07/861,141 filed Mar. 31, 1992, by Tatsuo Nakato and entitled, GRADED IMPLANTATION OF OXYGEN AND/OR NITROGEN CONSTITUENTS TO DEFINE BURIED ISOLATION REGION IN SEMICONDUCTOR DEVICES; and

3. Description of the Related Art

SIMOX devices (Separation by IMplanted OXygen) employ an implanted layer of silicon oxide between an active device layer and a bulk portion of a supporting substrate. The implanted dielectric layer provides DC isolation between the substrate bulk portion and active devices in the active device portion of the substrate. The dielectric layer also minimizes capacitance between the active devices and the bulk portion of the substrate.

A typical SIMOX fabrication process includes implanting a layer of oxygen atoms at a dose of approximately $0.2 \times 10^{18}$ atoms/cm$^2$ – $2.0 \times 10^{18}$ atoms/cm$^2$ with an energy of about 20–200 KeV in a temperature range of about 450° C.–650° C. This implant is followed by annealing at a temperature of about 1150° C.–1400° C. The annealing steps removes some of the implantation damage, distributes the implanted oxygen atoms among neighboring silicon atoms and helps the implanted oxygen atoms to react with the neighboring silicon atoms, thereby forming a buried, stoichiometric SiO$_2$ layer.

Generally speaking, the SIMOX process is a rather expensive undertaking due to the large amount of oxygen implantation necessary and the lengthy amount of time required to complete implantation. If time and energy are to be invested in the formation of devices having implanted dielectric layers, it is desirable to have a cost-effective method for assuring high yields in mass production environments.

Several problems exist within the conventional SIMOX process. One of them is an undesirable formation of small pin holes or thinned sections in the dielectric layer. This occurs because unwanted contamination particles are often found at random spots on the substrate surface during oxygen implantation. Some of the surface contaminating particles completely block oxygen ions from entering the substrate. Others of the surface contaminating particles reduce the velocity of some of the oxygen ions that are to be implanted at a desired depth below the substrate surface and thereby divert them to different depth. Complete blockage produces a pin hole. Diversion due to velocity reduction produces a thin section. Sometimes a small contaminating particle completely blocks oxygen ions in a small area but the resulting pin-hole is partially filled by scattering from adjacent implant beams. This also produces a thin section.

Pin-holes and/or thin sections in a buried dielectric layer disadvantageously increase leakage current through the dielectric layer and/or decrease the breakdown voltage of the dielectric layer. This adversely affects the ultimate performance of devices formed under the SIMOX process and tends to reduce mass production yields.

SUMMARY OF THE INVENTION

The invention overcomes the above-mentioned problems by providing a method and structure in which a PN isolating junction is formed within or near an implanted dielectric layer for the purpose of patching pin-holes and/or thin-section defects in an implanted dielectric layer.

A method in accordance with the invention comprises the steps of: (a) implanting oxygen and/or nitrogen into a monocrystalline silicon substrate (wafer) at a desired first range of depths $D_1$ below a surface of the substrate, where the substrate has a prespecified bulk conductivity of a first type (e.g., P); (b) annealing the implanted substrate to from a substantially stoichiometric buried dielectric layer at the first depth $D_1$; (c) implanting doping ions into the silicon substrate at second range of depths $D_2$ below the surface of the substrate, where the doping ions are selected to form a region having a conductivity (e.g., N) opposite to the first conductivity type (e.g., P) and where the second range of depths $D_2$ is substantially the same as or within the first range of depths $D_1$ of the implanted dielectric layer; and (d) again annealing the substrate to form a PN junction within the implanted dielectric layer for the purpose of complementing or enhancing or reinforcing the isolation function of the implanted dielectric layer or patching pin-hole and thin-section defects in the implanted dielectric layer.

A structure in accordance with the invention comprises: (a) a silicon substrate having a prespecified bulk conductivity of a first type (e.g., P); (b) a buried dielectric layer implanted at a desired first range of depths $D_1$ below a major surface of the substrate; and (c) a reverse-biased PN junction formed within the depths range $D_1$ of the implanted dielectric layer, said PN junction being provided for the purpose of complementing or enhancing or reinforcing the isolation function of the implanted dielectric layer or patching pin-hole and thin-section defects in the implanted dielectric layer.

BRIEF DESCRIPTION OF THE DRAWINGS

The below detailed description makes reference to the accompanying drawings, in which.

DETAILED DESCRIPTION

Figure 1:
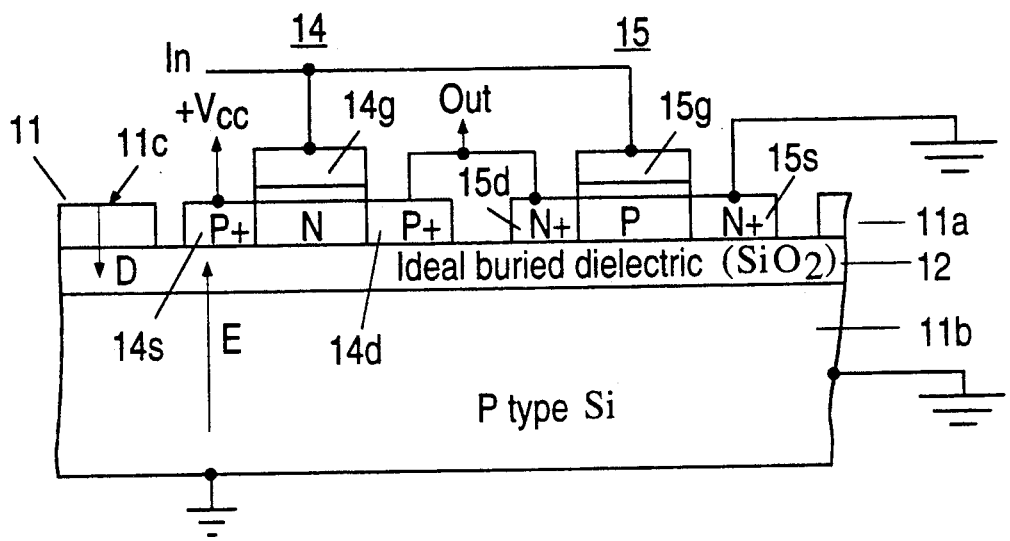
FIG. 1 is a cross sectional side view of an ideal SIMOX device.

FIG. 1 shows a cross sectional side view of an "ideal" SIMOX device 10. Device 10 is termed "ideal" because it is presumed to have a perfectly uniform, defect-free, dielectric layer 12 formed at a desired depth D below a top surface 11c of a silicon substrate 11. The uniform dielectric layer 12 isolates an active device portion 11a of the substrate 11 from a bulk portion 11b of the substrate 11.

For purposes of example, the bulk portion 11b of the substrate 11 is shown to have a P-type conductivity. The active device portion 11a is shown to include a CMOS circuit composed of a P-channel MOSFET (metal/oxide/-semiconductor field effect transistor) 14 and an N-channel MOSFET 15. The P-transistor 14 and N-transistor 15 are connected in series to form a CMOS inverter or amplifier. The P-type bulk portion 11b of the substrate is connected to a ground voltage. A P+ source region 14s of the P-transistor 14 is connected to a relatively high positive supply voltage, +Vcc.

An electric field E develops across the buried dielectric layer 12 as a result of the voltage gradient between the P+ source region 14s and the grounded bulk portion 11b. Buried dielectric layer 12 ideally blocks leakage current from flowing between the P+ source region 14s and the bulk portion 11b of the substrate. Dielectric layer 12 also reduces high frequency capacitive coupling between the active device portion 11a and the bulk portion 11b.

The remainder of the illustrated CMOS circuit comprises a P+ drain region 14d of P-transistor 14 coupled to an N+ drain region 15d of N-transistor 15, an output node formed at the juncture of drain regions 14d, 15d and a ground connection made to a N+ source region 15s of N-transistor 15. The gate electrode 14g of P-transistor 14 connects to the gate electrode 15g of N-transistor 15 to define an input.

The illustrated "ideal" SIMOX device 10 should be able to operate with a relatively large positive supply voltage, +Vcc, and minimal leakage from the +Vcc connection to ground because of the DC isolation provided by the uniform buried dielectric layer 12. The ideal SIMOX device 10 should also be able to operate at a relatively high frequency with good gain characteristics because of the AC isolation provided by the uniform buried dielectric layer 12.

Figure 2A:
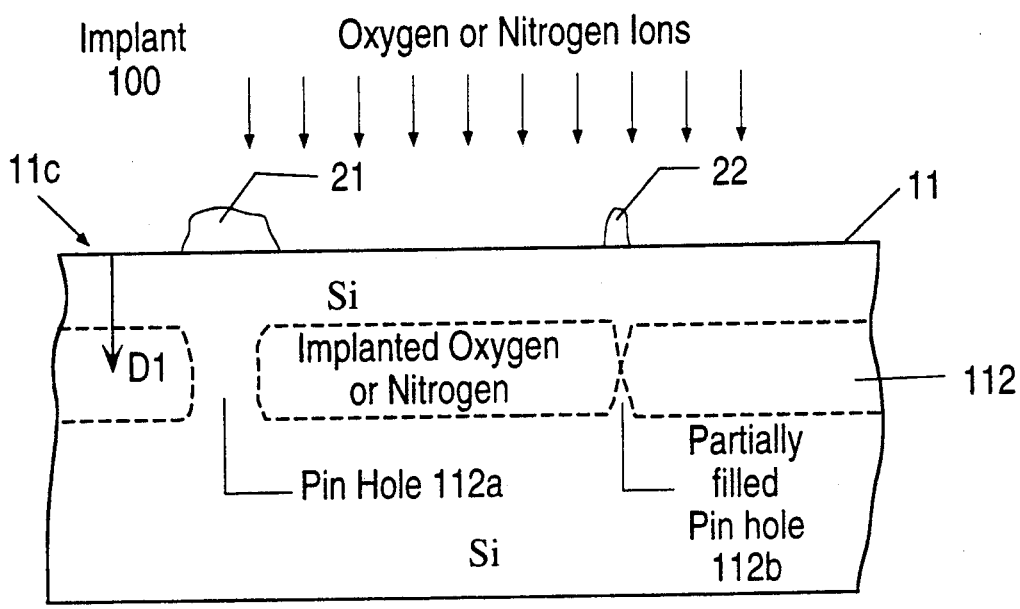
FIGS. 2A and 2B are cross sectional side views respectively showing a conventional first implant step and first anneal step for forming a buried dielectric layer where a first set of contaminating surface particles are present during the first implant step.
Figure 2B:
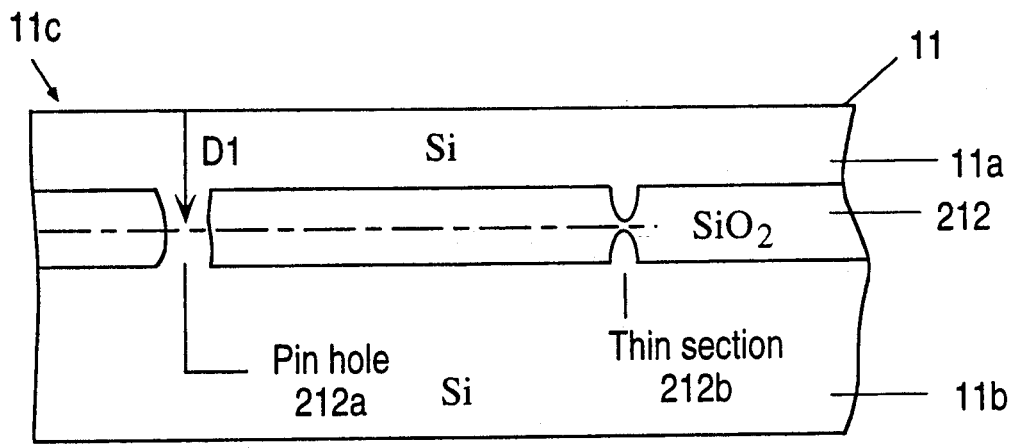

Unfortunately, in practice, it is difficult to fabricate an "ideal" buried dielectric layer 12 of a type having uniform thickness and other uniform characteristics as suggested by FIG. 1. FIGS. 2A and 2B show the reason why.

During a first implant step 100 (FIG. 2A) where oxygen or nitrogen ions are to be implanted into substrate 11 at a first depth or first range of depths D1 (the desired range of depths is represented by the horizontal upper and lower dashed borders of region 112), a first set of contaminating surface particles 21, 22 are invariably found at random spots on the surface 11c of the substrate in spite of various cleaning attempts and clean room precautions. The locations of the first set of contaminating surface particles 21, 22 vary randomly from one implant to another and the degree to which they affect the first implant step 100 also vary.

Large contaminating particles such as 21 that are composed of an implant blocking material (e.g., dust or flakes of human skin) tend to substantially block the oxygen or nitrogen ions of first implant step 100 thereby producing a pin-hole 112a at the implant depth (or depths) $D_1$ of implant region 112. Smaller contaminating particles 22, or particles that are composed of materials that reduce the velocity of the implant ions, tend to produce regions of low implant concentration such as that shown at 112b of FIG. 2A. (Usually, the area of low implant concentration 112b is a small pin-hole that has been partially filled by scattered implant atoms.)

Referring to FIG. 2B, when a subsequent annealing step 200 is carried out, the implanted oxygen or nitrogen atoms react with the silicon atoms of substrate 11 and form one or more regions 212 of stoichiometric $SiO_2$ or $Si_3N_4$. Each implant pin-hole 112a leaves behind a corresponding pin-hole 212a in the resulting $SiO_2$ or $Si_3N_4$ dielectric layer 212. Each low implant concentration subregion 112b leaves behind a corresponding thin-section 212b in the resulting $SiO_2$ or $Si_3N_4$ dielectric layer 212. (The thin-section 212b represents a relatively low concentration of $SiO_2$ or $Si_3N_4$ at the implant depth $D_1$. Regions which received a heavier concentration of oxygen or nitrogen atoms during the first implant step 100 are represented as thicker portions of the resulting $SiO_2$ or $Si_3N_4$ dielectric layer 212.)

Thin-sections such as 212b are undesirable because: (1) they tend to increase leakage current through the SIMOX dielectric layer 212, (2) they tend to increase capacitive coupling through the SIMOX dielectric layer 212, and (3) they tend to reduce the breakdown voltage of the SIMOX dielectric layer 212. Pin-holes such as 212a are even more undesirable because: (4) they tend to substantially increase the amount of leakage current flowing through the SIMOX dielectric layer 212, (5) they provide a gain-reducing path to ground (or to another bulk voltage) for signals that are preferably separated from ground, and (6) they can drop the breakdown voltage of the SIMOX dielectric layer 212 to a value close to zero; thus rendering the device practically useless.

Figure 3A:
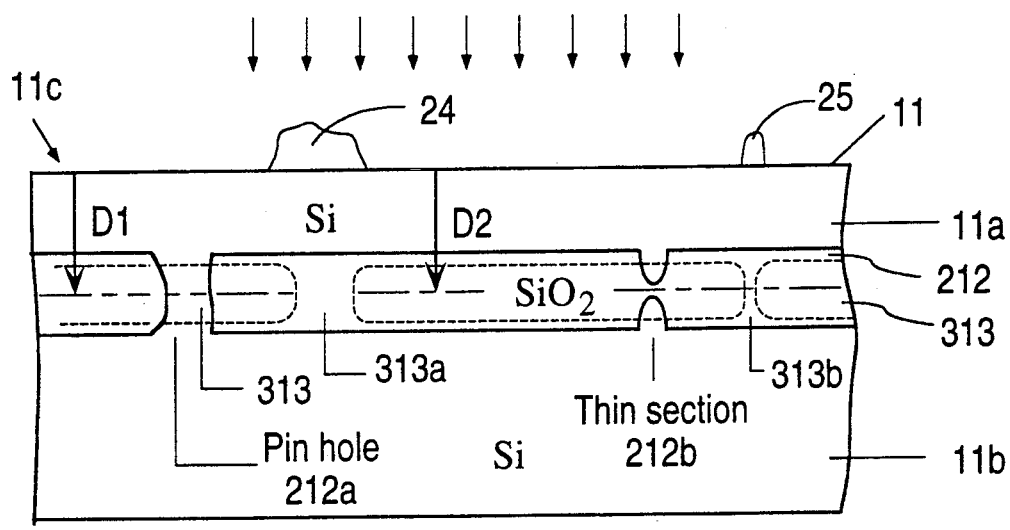
FIGS. 3A and 3B are cross sectional side views respectively showing a second implant step and second anneal step in accordance with the invention for forming a buried PN junction where a second set of contaminating surface particles are present during the second implant step.

Referring to FIG. 3A, the invention adds a patching step to the conventional SIMOX fabrication process. A P or N doping species (e.g., boron or aluminum for P-type doping, phosphorous or arsenic for N-type doping) of a conductivity type opposite to that of the substrate bulk is implanted at a depth range $D_2$ which approximately the same or within depth range $D_1$ of the first implant step 100. (The desired range of depths $D_2$ is represented by the horizontal upper and lower dashed borders of region 313. If it is a problem to assure that depth range $D_2$ will be entirely within depth range $D_1$, then as a next best arrangement it is preferable to keep the upper bound of $D_2$ below the upper bound of $_D1$ while allowing the lower bound of $D_2$ to descend below the lower bound of $D_1$. In this way, the active device portion 11a is not contaminated by the dopants of P/N implant layer 313. If unavoidable, the upper and lower bounds of $D_2$ may extend outside the bounds of $D_1$.)

At least one surface cleaning step (not shown) is understood to have occurred between the first, oxygen and/or nitrogen implant step 100 and the second, P or N implant step 300 so that a new random distribution of contaminating surface particles 24, 25 is found on substrate surface 11c. There is a high probability that the new distribution of contaminating surface particles 24, 25 is substantially different from the distribution present during the first implant step 100 of FIG. 2A.

The new distribution of contaminating surface particles 24, 25 might still contain a contaminating particle such as 24 which completely blocks dopant implant below it and thereby creates a P/N pin-hole 313a in the P/N implant region 313, but it is highly unlikely that particle 24 will be aligned over pin-hole 212a or thin-section 212b of the dielectric layer 212. It is therefore highly probable, that at each dielectric pin-hole 212a or thin-section 212b, a continuous overlying or overlapping portion 313 of the P/N dopant implant 300 will be present.

Figure 3B:
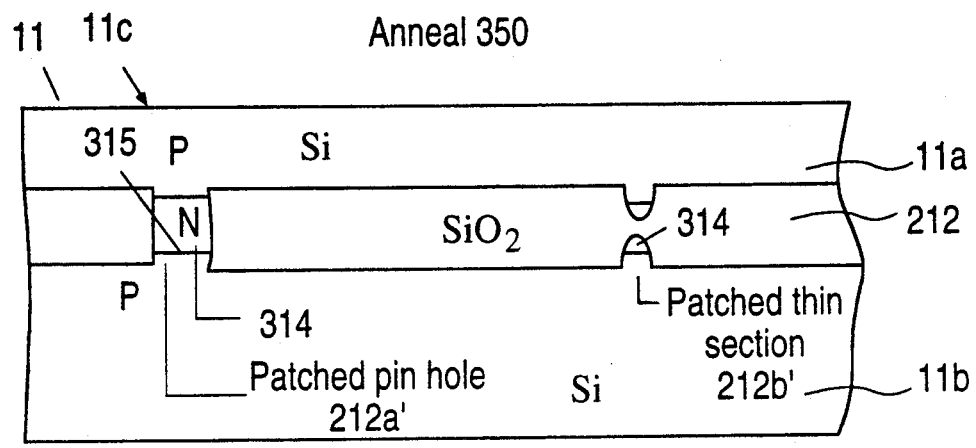

As seen in FIG. 3B, a subsequent anneal step 350 converts parts of the P/N implant region 313 that overlaps non-insulative material into a P or N buried region 314 which fills the pin-hole 212a and thin-section 212b. Parts of the P/N implant region 313 that lodge inside insulative material 212 remain trapped inside the insulative material 212.

For the sake of example, the substrate 11 is assumed to have a P conductivity type distributed over its bulk. The P/N dopant implant step 300 accordingly uses an opposed N-type dopant such as arsenic. (Arsenic is preferred because it has the advantage of a relatively low diffusion rate. The implanted N-type doping species therefore tend to remain within the implant depth range $D_2$ where they were originally placed.) The N-type buried regions 314 shown in FIG. 3B are therefore obtained as a result of anneal step 350.

Because the region 11b below the N-type buried regions 314 is of the opposite P conductivity type, a PN junction 315 is formed at the juncture of the buried N regions 314 and the bulk portion 11b. Note that the pin-hole defects 313a and 313b (FIG. 3A) of the P/N implant step 300 of FIG. 3A are imbedded in the dielectric layer 212. Note further that the pin-hole 212a and thin-section defects 212b arising from the O/N implant step 100 of FIG. 2A are plugged by the N-type regions 314.

Figure 4:
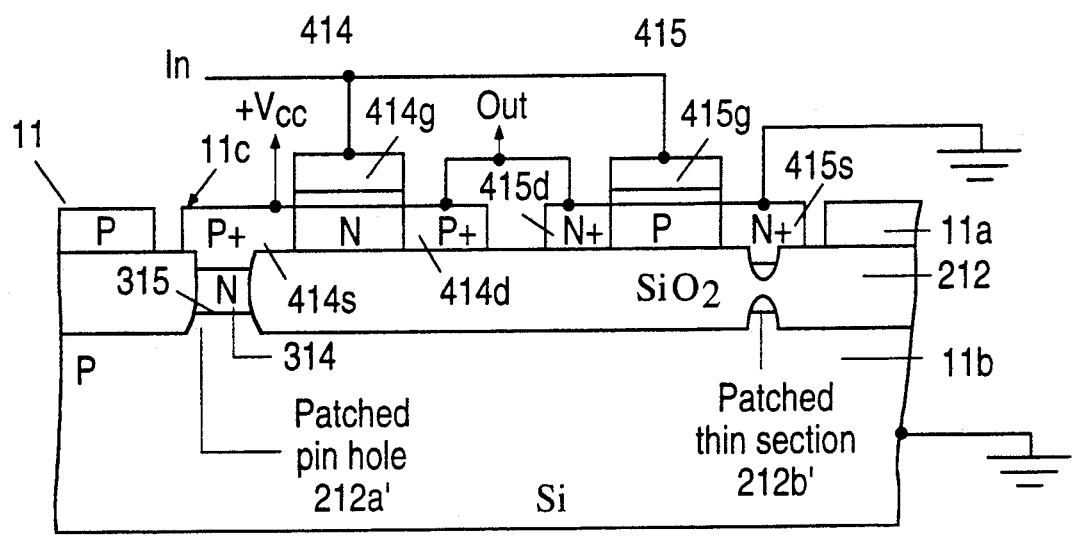
FIG. 4 is a cross sectional side view of a SIMOX device in accordance with the invention.

FIG. 4 shows a cross section of the structure after subsequent processing in which active devices are formed in the active device portion 11a of the substrate. Like reference symbols and numbers in the "400" series are used for elements of FIG. 4 which correspond to but are not necessarily the same as the elements represented by similar symbols and reference numbers of the "1–99" series in FIG. 1. As such, an introductory description of the elements found in FIG. 4 is omitted here.

It is seen that the PN junction 315 at the lower surface of buried region 314 becomes reverse biased when electric field E (see FIG. 1) develops between the P+ source region 414s of transistor 414 and the grounded bulk portion 11b. In places where the direction of the electric field E (see FIG. 1) is reversed, for whatever reason, the upper PN junction of region 314 will become reverse biased. A charge depletion zone (not shown) develops around each reverse biased PN junction 315 of each buried region 314. Depending on the electric field present at each site, charge depletion can occur at one or both the sites of the patched pin-hole 212a' and the patched thin-section 212b'. Majority charge carriers can be pulled away from the reverse-biased PN junction 315 by the action of the electric field E (see FIG. 1) at the site.

If desired, a conductive vertical via (not shown) could be formed at the edge of the substrate (wafer) 11 for creating a so-called "body-tie" that connects the bulk portion 11b to a voltage developed at a top portion of the substrate 11. In such a case the electric field E through the dielectric layer 212 may point in a direction opposite to that shown and the reversible PN junction might form at the top of region 314 rather than at the bottom.

The charge depletion zone of reverse biased PN junction 315 provides a back up type of isolation at spots such as pin-hole 212a and thin-section 212b where the isolation function of dielectric layer 212 is stressed by an extant E field and is prone to break down. Mass production yields are increased when compared to the conventional SIMOX process, and improved device performance is obtained.

A specific isolation forming method in accordance with the invention comprises the steps of:

1. Implanting (100) oxygen and/or nitrogen into a monocrystalline silicon substrate with appropriate implant energy (e.g., 20 KeV to 200 KeV, or more preferably: 20 KeV to 100 KeV.) and a desired concentration (e.g., $0.2 \times 10^{18}$ atoms/cm$^2$ to $2 \times 10^{18}$ atoms/cm$^2$) to form a buried dielectric layer (212) having a thickness of approximately 200 Angstroms to 2000 Å located approximately 100 Å to 5000 Å below (, or more preferably: 150 Å to 4000 Å below) a top surface (11c) of an active device portion (11a) of the substrate.

2. Annealing (200) the substrate at a relatively high temperature of 1000° C. to 1400° C. for an appropriate duration (e.g., 0.1 hour to 12 hours) in order to form a substantially stoichiometric insulation layer (212) of a desired constitution. The desired constitution and corresponding anneal conditions will vary from case to case depending on the number and kind of defects that are acceptable in the superficial silicon layer 11a and the number and kind of defects that are acceptable in the dielectric layer 212. The latter depend in turn on O/N implant conditions such as beam current density, doping level, temperature and energy.

3. Implanting (300) doping ions of a conductivity type opposite to the conductivity type that exists or is to be created in the active device portion 11a of the substrate in order to form a reverse biasable PN junction (315) substantially near or at the depth of the implant-defined dielectric layer (212). Preferably the implanted doping species are confined to a range of depths well inside the range of depths defining the dielectric layer (212) such that substantially none of the P or N doping species appear outside the range of depths occupied by the dielectric layer (212). If, for some reason, the implanted doping species need to extend outside the range of depths ($D_1$) defining the dielectric layer (212), it is preferable that they extend below rather than above the range of depths ($D_1$) defining the dielectric layer (212). The energy and concentration of the doping ions is selected to form a desired kind of reverse-biasable PN junction. The reverse-biasable PN junction preferably has low leakage current and minimal diffusion at later process steps. In the case of a P-type bulk portion (11b) it is advisable to use a slow-diffusing agent such as arsenic for forming an N+/P junction at 315.

4. Annealing (350) the substrate a second time to activate the implanted doping atoms (P or N) and thereby create the reverse biasable PN junction (315) at a desired depth.

It is to be understood that the dielectric layer 212 does not have to be composed of one or the other of SiO$_2$ or Si$_3$N$_4$. It can be composed of combinations of these materials and can have the more generalized form: Si$_x$O$_y$N$_z$, where the sum of integers x+y+z is in the range 3 to 7. A description of a method for forming such a Si$_x$O$_y$N$_z$ dielectric layer may be found in the above-cited and here incorporated U.S. application Ser. No.

07/861,141, filed Mar. 31, 1992 by Tatsuo Nakato, entitled, GRADED IMPLANTATION OF OXYGEN AND/OR NITROGEN CONSTITUENTS TO DEFINE BURIED ISOLATION REGION IN SEMICONDUCTOR DEVICES. Also, the order of forming the (SiO$_2$) dielectric layer 212 and the oppositely-doped buried layer (314) "could" be reversed. However, it is preferable to form the dielectric layer 212 first because higher temperatures and longer anneal times are often used for annealing the O/N implant region 112 as compared to those used for annealing the P/N implant layer 313.

The above disclosure is to be taken as illustrative of the invention, not as limiting its scope or spirit. Numerous modifications and variations will become apparent to those skilled in the art after studying the above disclosure.

Given the above disclosure of general concepts and specific embodiments, the scope of protection sought is to be defined by the claims appended hereto.

What is claimed is:

1. A method of forming isolation for an integrated circuit comprising the steps of:
   (a) implanting oxygen and/or nitrogen into a silicon substrate at a desired first range of depths, $D_1$, below a surface of the substrate, where a top portion of the substrate has or is to have a prespecified bulk conductivity of a first type;
   (b) annealing the substrate to thereby react the implanted oxygen and/or nitrogen with the silicon of the substrate and form a buried dielectric layer at the first range of depths, $D_1$, where the formed dielectric layer is susceptible to having pin-hole defects and/or thin-sections;
   (c) implanting doping atoms into the silicon substrate at second range of depths, $D_2$, below the surface of the substrate, where the doping atoms are selected to form a region having a conductivity opposite to the first conductivity type and where the second range of depths, $D_2$, is substantially the same or within the first range of depths, $D_1$, of the dielectric layer; and
   (d) again annealing the substrate to diffuse the implanted doping atoms and thereby from a reverse-biasable PN junction within or substantially near to existing, if any, pin-hole defects and/or thin-sections of the dielectric layer for the purpose of complementing or enhancing or reinforcing the isolation function of the dielectric layer or patching isolation weaknesses caused by said pin-hole and thin-section defects of the dielectric layer, if any.

* * * * *